(12) United States Patent
Li

(10) Patent No.: US 12,062,555 B2
(45) Date of Patent: Aug. 13, 2024

(54) MICRO LIGHT-EMITTING DIODE MASS TRANSFER APPARATUS AND METHOD

(71) Applicant: CHONGQING KONKA PHOTOELECTRIC TECHNOLOGY RESEARCH INSTITUTE CO., LTD., Chongqing (CN)

(72) Inventor: Qiang Li, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 531 days.

(21) Appl. No.: 17/383,464

(22) Filed: Jul. 23, 2021

(65) Prior Publication Data

US 2021/0384050 A1 Dec. 9, 2021

Related U.S. Application Data

(63) Continuation of application No. PCT/CN2020/094232, filed on Jun. 3, 2020.

(51) Int. Cl.
*H01L 21/67* (2006.01)
*H01L 25/075* (2006.01)
*H01L 33/62* (2010.01)

(52) U.S. Cl.
CPC .... *H01L 21/67121* (2013.01); *H01L 25/0753* (2013.01); *H01L 33/62* (2013.01); *H01L 2933/0066* (2013.01)

(58) Field of Classification Search
CPC ......... H01L 21/67121; H01L 21/67144; H01L 25/0753; H01L 33/62; H01L 33/0095
See application file for complete search history.

(56) References Cited

U.S. PATENT DOCUMENTS

2017/0062492 A1 3/2017 Bae et al.
2019/0027642 A1* 1/2019 Zou .................. H01L 33/48
2019/0296184 A1* 9/2019 Ahmed ............. H01L 33/0095

FOREIGN PATENT DOCUMENTS

CN 107425101 A 12/2017
CN 109637957 A 4/2019
(Continued)

OTHER PUBLICATIONS

First examination report of corresponding CN application No. 202010496154.X.
(Continued)

*Primary Examiner* — Marc Anthony Armand
(74) *Attorney, Agent, or Firm* — Samson G. Yu

(57) ABSTRACT

The disclosure provides a micro light-emitting diode mass transfer apparatus and method. The micro light-emitting diode mass transfer apparatus includes a solution container, display backplanes, a solution drive assembly and a liquid level control assembly. The solution container contains a transfer solution, and micro light-emitting diodes to be transferred float on the liquid surface of the transfer solution. The display backplanes are submerged in the transfer solution and each provided with a plurality of chip mounting cells; mounting cell opening directions of the plurality of chip mounting cells face toward the micro light-emitting diodes; and at least one of the chip mounting cells is exposed on the liquid surface. The solution drive assembly is disposed in the solution container. The liquid level control assembly is configured to control a liquid level of the transfer solution in the solution container. The liquid level control assembly controls the liquid level of the transfer solution, the solution drive assembly provides a centrifugal force to the transfer solution, and the micro light-emitting
(Continued)

diodes are precisely transferred into the corresponding chip mounting cells through the centrifugal force.

9 Claims, 5 Drawing Sheets

(56) References Cited

FOREIGN PATENT DOCUMENTS

| | | | |
|---|---|---|---|
| CN | 109661163 A | 4/2019 | |
| CN | 110112090 A | 8/2019 | |
| CN | 110148655 A | 8/2019 | |
| CN | 110518098 A | 11/2019 | |
| CN | 110611018 A | 12/2019 | |
| CN | 110752167 A | 2/2020 | |
| CN | 110767582 A | 2/2020 | |
| CN | 111146129 A | 5/2020 | |
| CN | 111276438 A | 6/2020 | |

OTHER PUBLICATIONS

International Search Report for corresponding application PCT/CN2020/094232 filed Jun. 3, 2020; Mail date Feb. 24, 2021.

* cited by examiner

MICRO LIGHT-EMITTING DIODE MASS TRANSFER APPARATUS AND METHOD

TECHNICAL FIELD

The disclosure relates to the field of Light-Emitting Diode (LED) technologies, in particular to a micro LED mass transfer apparatus and further to a micro LED mass transfer method.

BACKGROUND

A micro LED has better photoelectric efficiency, brightness and contrast ratio and lower power consumption than a general LED. In order to implement a display function, a plurality of micro LEDs are required to be mounted on a lighting backplane to form a micro LED array. Single chips of the micro LEDs are small in size and quite difficult to prepare, and therefore a mass transfer technology is the key to forming the micro LED array on a micro LED display apparatus.

Currently, a preparation method of the micro LED display apparatus includes: firstly, transferring micro LED chips on a growth substrate to a temporary substrate by transfer heads or other means; then, transferring red, green, and blue micro LED chips in batches to a display backplane by aids of a precise alignment device, and arranging the chips according to certain rules; and repeating the previous two steps until completing transfer of all the micro LEDs.

A large number of micro LEDs are arranged on the micro LED display apparatus. Therefore, in the foregoing mass transfer solution, due to the fact that the chips to be transferred are large in number and small in size, alignment precision requirements are extremely high, and configuration of high-standard transfer devices is needed in the industry, otherwise, mass transfer with low cost and high efficiency may be failed.

SUMMARY

The technical problem to be solved by the disclosure is to provide a micro LED mass transfer apparatus and method in view of the above-mentioned defects of the related art, which can achieve mass transfer with simple devices and have the advantages such as low cost and high efficiency.

The technical solutions adopted by the disclosure to solve the technical problem are as follows.

In a first aspect, the disclosure provides a micro LED mass transfer apparatus, including a solution container, one or a plurality of display backplanes, a solution drive assembly, and a liquid level control assembly. The solution container contains a transfer solution, and micro LEDs to be transferred float on the liquid surface of the transfer solution. one or a plurality of display backplanes are submerged in the transfer solution and the one display backplane or each of the plurality of display backplane is provided with a plurality of chip mounting cells; mounting cell opening directions of the plurality of chip mounting cells face toward the micro LEDs; and at least one of the chip mounting cells is exposed on the liquid surface. The solution drive assembly is disposed in the solution container and configured to provide a centrifugal force to the transfer solution, so that the micro LEDs are driven to move into the at least one chip mounting cell exposed on the liquid surface under action of the centrifugal force and a buoyancy provided by the transfer solution. The liquid level control assembly is connected to the solution container and configured to control a liquid level of the transfer solution in the solution container so as to expose at least one more chip mounting cell or submerge a part of the chip mounting cells exposed before.

Compared with the related art, the technical solutions have the beneficial effects that the display backplanes, the micro LEDs, and the like are placed in the transfer solution in the solution container, the liquid level control assembly controls the liquid level of the transfer solution, the solution drive assembly provides the centrifugal force to the transfer solution, the micro LEDs are precisely transferred into the corresponding chip mounting cells through the centrifugal force, and thus mass transfer is achieved by means of simple devices, with the advantages such as low cost and high efficiency.

Further, the solution drive assembly includes a drive shaft, an impeller, and a drive motor; the drive shaft is disposed in the center of the solution container, the impeller is fixedly disposed on the drive shaft, one end of the drive shaft extending out of the solution container, and is connected to the drive motor; and the drive motor drives the impeller to rotate through the drive shaft, thereby providing a centrifugal force to the transfer solution in the solution container.

The beneficial effects of adopting the above solution include: the solution drive assembly is composed of the drive shaft, the impeller, and the drive motor, the drive motor drives the impeller through the drive shaft, and thus the centrifugal force is provided by a simple structure to the transfer solution in the solution container.

Further, the chip mounting cells each are of a flared structure.

The beneficial effects of adopting the above solution include: the chip mounting cells each are set as the flared structure that may implement a guide function, which facilitates entering of the micro LEDs and can effectively improve mass transfer efficiency.

Further, each chip mounting cell is composed of a mounting cell bottom surface, a mounting cell opening and a mounting cell lateral side; the area of the mounting cell bottom surface is smaller than that of the mounting cell opening, and the mounting cell lateral side gradually slopes from the mounting cell opening to the mounting cell bottom surface.

The beneficial effects of adopting the above solution include: the mounting cell bottom surface, the mounting cell opening, and the mounting cell lateral side form the flared structure so that the chip mounting chip has the advantages of simple structure and easiness in forming.

Further, the transfer solution refers to a N-methylpyrrolidone solution or an acetone solution.

The beneficial effect of adopting the above solution includes: facilitating directly transferring the micro LEDs into the transfer solution from the growth substrate.

Further, a solution temporary-storage container is also included and connected to the solution container.

The beneficial effect of adopting the above solution includes: the solution temporary-storage container is provided to control the liquid level of the transfer solution.

Further, the liquid level control assembly includes: a solution pipeline, wherein the solution popeline connected to the solution container, a liquid level control pump disposed on the solution pipeline and configured to control the liquid level of the transfer solution in the solution container.

Further, the display backplanes are vertically arranged in the transfer solution and each provided with a plurality of chip mounting cells distributed in an array, and the plurality of chip mounting cells in each horizontal line are parallel to the liquid surface of the transfer solution.

The beneficial effects of adopting the above solution include: since the display backplanes are vertically arranged in the transfer solution, the chip mounting cells, in each horizontal line, of the plurality of chip mounting cells distributed in an array are parallel to the liquid surface of the transfer solution, so that the micro LEDs can be transferred into the corresponding chip mounting cells under action of the centrifugal force.

Further, the solution container is of a circular barrel structure.

The beneficial effects of adopting the above solution include: the solution container is set as the circular barrel structure so that the mass transfer apparatus can accommodate more display backplanes simultaneously, facilitating further improvement of the mass transfer efficiency.

Further, a chip filter screen is also disposed in the solution container and particularly disposed at the bottom of the solution container.

The beneficial effects of adopting the above solution include: the chip filter screen provided is configured to collect remaining micro LEDs, which can prevent the micro LEDs entering a circulation of the transfer solution on the one hand, and can collect the micro LEDs for subsequent use on the other hand.

Further, the solution container includes a container side wall and a container bottom; the container bottom is of a funnel structure, and the chip filter screen is disposed in the container bottom.

The beneficial effect of adopting the above solution includes: the container bottom is set as the funnel structure, which is conductive to increasing collection efficiency of the remaining micro LEDs.

In a second aspect, the present application provides a micro LED mass transfer method. The method based on the micro LED mass transfer apparatus includes the following steps.

Micro LEDs on a substrate are peeled off to fall into a solution container, herein the solution container contains a transfer solution, the micro LEDs float on the liquid surface of the transfer solution, and display backplanes are disposed in the solution container and each provided with a plurality of chip mounting cells.

A level difference between the liquid surface and target mounting cells of the plurality of chip mounting cells is controlled to reach a preset value, herein the target mounting cells refer to at least one of the plurality of cell mounting cells.

The transfer solution is driven to move to generate a centrifugal force so that the micro LEDs floating on the liquid surface of the transfer solution are driven into the target mounting cells.

Compared with the related art, the technical solutions have the beneficial effects that the display backplanes, the micro LEDs, and the like are placed in the transfer solution in the solution container, the liquid level control assembly controls the liquid level of the transfer solution, the solution drive assembly provides the centrifugal force to the transfer solution, the micro LEDs are precisely transferred into the corresponding chip mounting cells through the centrifugal force, and thus mass transfer is achieved by means of simple devices, with the advantages such as low cost and high efficiency.

Further, the substrate is a growth substrate, the process of peeling off the micro LEDs on the substrate into the solution container includes: peeling off the micro LEDs on the growth substrate through laser, so that the micro LEDs separated from the growth substrate fall in the transfer solution under action of gravity.

Further, the substrate is a temporary substrate. The process of peeling off the micro LEDs on the substrate into the solution container includes: submerging the temporary substrate in the transfer solution, and dissolving a chip bonding layer between the temporary substrate and the micro LEDs through the transfer solution, so that the micro LEDs are separated from the temporary substrate to directly fall into the transfer solution.

The beneficial effects of adopting the above solution include: different peeling off modes can be adopted for different substrates, and accordingly higher adaptability is achieved.

Further, the micro LEDs include at least red micro LEDs, green micro LEDs, and blue micro LEDs.

The beneficial effects of adopting the above solution include: during mass transfer, the red micro LEDs, the green micro LEDs, and the blue micro LEDs are mounted on the display backplanes, which can implement a full-color display function.

Further, the micro LEDs include at least two types of micro LEDs. The method specifically includes the following steps.

One type of micro LEDs are peeled off to fall into the solution container.

A level difference between the liquid surface and the target mounting cells of the micro LEDs is controlled to reach a preset value.

The transfer solution is driven to move to generate a centrifugal force so that the type of micro LEDs floating on the liquid surface of the transfer solution is driven into the corresponding target mounting cells.

The level difference between the liquid surface and the other target mounting cells for mounting of the type of micro LEDs is controlled again to reach the preset value, and the transfer solution is further driven to move to generate a centrifugal force, so that the type of micro LEDs are driven to fall into the other target mounting cells until transfer of the type of micro LEDs required to be mounted in the target mounting cells is completed.

The type of micro LEDs are replaced with another type of micro LEDs which are peeled off to fall into the solution container.

A level difference between the liquid surface and the target mounting cells of the micro LEDs is controlled to reach a preset value.

The transfer solution is driven to move to generate a centrifugal force so that another type of micro LEDs floating on the liquid surface of the transfer solution are driven into the corresponding target mounting cells.

The level difference between the liquid surface and the other target mounting cells for mounting of another type of micro LEDs is controlled again to reach the preset value, and the transfer solution is further driven to move to generate a centrifugal force, so that another type of the micro LEDs are driven to fall into the other target mounting cells until transfer of another type of micro LEDs required to be mounted in the target mounting cells is completed.

The beneficial effects of adopting the above solution include: different types of micro LEDs can be conveniently mounted on one display backplane, and the mass transfer efficiency can be increased effectively.

Further, before replacing with another type of micro LEDs, the following is included.

All previous type of micro LEDs are taken out.

The beneficial effects of adopting the above solution include: being conductive to ensuring that various types of micro LEDs can be precisely mounted at specific positions thereof.

Figure 1:
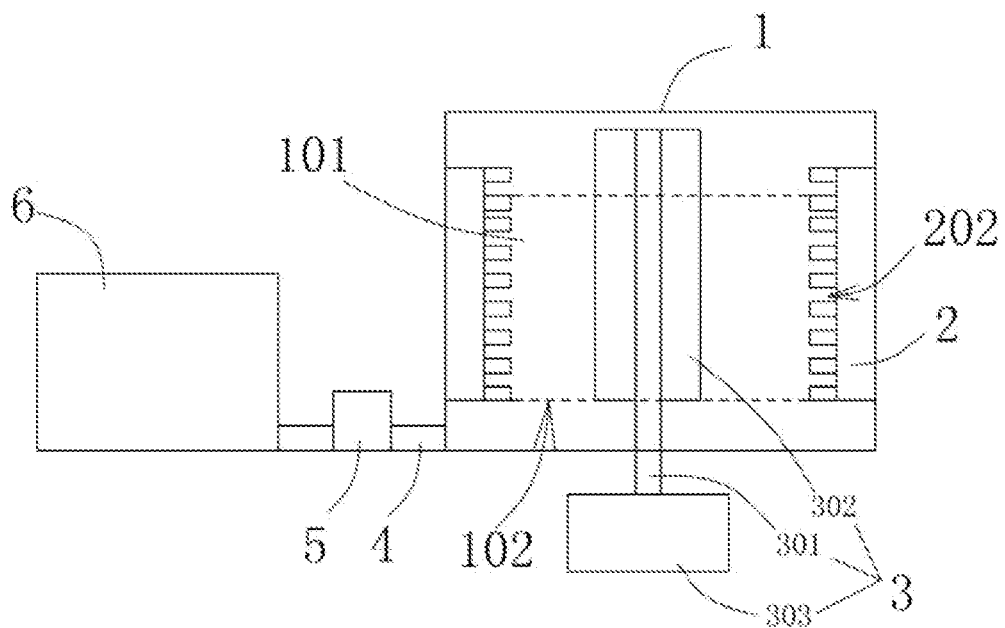
FIG. 1 is an overall schematic diagram of a micro LED mass transfer apparatus according to the disclosure.

In the drawings, components represented by the reference numerals are shown in the following list:

solution container 1, display backplane 2, solution drive assembly 3, solution pipeline 4, liquid level control pump 5, solution temporary-storage container 6, growth substrate 7, temporary substrate 8, and chip bonding layer 9;
transfer solution 101, and chip filter screen 102;
micro LED 201, and chip mounting cell 202; and
drive shaft 301, impeller 302, and drive motor 303.

DETAILED DESCRIPTION OF THE EMBODIMENTS

In order to make the objective, technical solutions and advantages of the disclosure clearer and more definite, the disclosure will further be described below with reference to the drawings and embodiments in detail. It is to be understood that the specific embodiments described herein are merely intended to explain the disclosure and not limit the disclosure.

In the descriptions of the disclosure, it is to be understood that orientation or position relationships indicated by terms "center", "up", "down", "front", "back", "left", "right" and the like are orientation or position relationships shown in the drawings, are adopted not to indicate or imply that indicated devices or components must be in specific orientations or structured and operated in specific orientations but only to conveniently describe the disclosure and simplify descriptions, and thus should not be understood as limits to the disclosure. In addition, terms "first" and "second" are only adopted for description and should not be understood to indicate or imply relative importance.

In the description of the disclosure, it is to be noted that unless otherwise specified and limited, terms "mounting", "connection" and "mutual connection" should be generally understood. For example, the connection may be fixed connection or detachable connection or integral connection, the connection may be mechanical connection or electrical connection, and the connection may be direct connection or indirect connection through an intermediate or communication inside two components. When one component is referred to as being "fixed to" or "disposed on" another component, the component may be directly on another component or an intermediate component may also be present. When one component is configured to be "connected" to another component, the component may be directly connected to another component or an intermediate component may be present at the same time. Those of ordinary skill in the art can understand specific implications of the above terms in the disclosure in specific situations.

Micro LEDs are widely concerned by the industry and popular to the market because of their outstanding performances. The Micro LEDs are required to be transferred onto a display backplane 2 and form an array on the display backplane 2, thereby implementing a display function as a whole. Due to the fact that single chips of the micro LEDs are small in size and difficult to prepare, production efficiency of the micro LEDs may be greatly limited if conventional LED tiling methods are adopted for production. Therefore, a mass transfer technology is the key to forming the micro LED array.

A conventional preparation method of a micro LED display apparatuses substantially includes the following steps: firstly, transferring micro LED chips on a growth substrate to a temporary substrate by transfer heads or other means; then, transferring red, green, and blue micro LED chips in batches to display backplanes by aids of a precise alignment device, and arranging the chips according to certain rules; and repeating the previous two steps until completing transfer of all the micro LEDs.

A large number of micro LEDs are arranged on the micro LED display apparatus. Therefore, in the foregoing mass transfer solution, due to the fact that the chips to be transferred are large in number and small in size, alignment precision requirements are extremely high. It is conceivable that manufacturers need to configure extremely high-standard transfer devices in order to carry out mass transfer. In other words, the industry needs to invest huge device costs to achieve high-efficiency mass transfer. It can be said that the limitation of the mass transfer technology is the bottleneck limiting the development of the micro LED display apparatuses.

As shown in FIG. 1, the disclosure provides a micro LED mass transfer apparatus, substantially including a solution container 1, one or a plurality of display backplanes 2, a solution drive assembly 3, and a liquid control assembly.

Specifically, the solution container 1 contains a transfer solution 101, and micro LEDs 201 to be transferred float on the liquid surface of the transfer solution 101; the display backplanes 2 are submerged in the transfer solution 101, and each provided with a plurality of chip mounting cells 202, mounting cell opening directions of the plurality of chip mounting cells 202 face toward the micro LEDs, and at least one of the plurality of chip mounting cells 202 is exposed on the liquid surface; the mounting cells are exposed on the liquid surface for the purpose of providing space for the micro LEDs 201 to enter the chip mounting cells 202; all or a part of the mounting cells may be exposed on the liquid surface, as along as the micro LEDs 201 can enter the chip mounting cells 202 correspondingly; and the solution drive assembly 3 is disposed in the solution container 1 and configured to provide a centrifugal force to the transfer solution 101.

The liquid level control assembly specifically includes a solution pipeline 4 and the solution container 1. The solution pipeline 4 is connected to the solution container 1 and contains the transfer solution 101. A liquid level control pump 5 is disposed on the solution pipeline 4 and configured to control the liquid level of the transfer solution 101 in the solution container 1. It is to be noted that adopting the solution pipeline 4 and the liquid level control pump 5 as the liquid level control assembly is only one of implementations of the disclosure. In a specific implementation process, other technical solutions may be adopted to control the liquid level. For example, a liquid level control switch may be provided, and digital intelligent control is realized through the liquid level control switch. The disclosure is not further limited here.

The liquid level control pump 5 is connected to the solution container 1 through the solution pipeline 4. With cooperation between the solution pipeline 4 and the liquid level control pump 5, the transfer solution 101 is pumped out or pumped into the solution container 1, thereby precisely controlling the liquid level of the solution container 1. The solution drive assembly 3 is configured to drive the transfer solution 101 contained in the solution container 1, and rotates to drive the transfer solution 101 to rotate to generate a centrifugal force.

The transfer solution 101 in the solution container 1 may be an organic or inorganic solution and plays a role of a transfer medium. On the one hand, the transfer solution generates a buoyancy to allow the to-be-transferred micro LEDs 201 to float thereon, and on the other hand, through the centrifugal force, the to-be-transferred the micro LEDs 201 floating on the liquid surface are driven to be transferred into the plurality of chip mounting cells 202 of the display backplanes 2.

Compared with using high-cost high-precision transfer devices to transfer the micro LEDs 201 to the display backplanes 2, in the disclosure, the display backplanes 2, the micro LEDs 201, and the like are placed in the transfer solution 101 in the solution container 1, the liquid level control pump 5 and the solution pipeline 4 serve as the liquid level control assembly to precisely control the liquid level of the transfer solution 101, the solution drive assembly 3 provides a centrifugal force to the transfer solution 101, the micro LEDs 201 are precisely transferred into the corresponding chip mounting cells through the centrifugal force, and thus mass transfer is achieved by means of simple devices, with the advantages such as low cost and high efficiency.

Preferably, each micro LED 201 is provided with a weight layer that is disposed on one side, close to the corresponding chip mounting cell 202, of the micro LED 201. The weight layer is substantially of a layer structure. With the weight layer, the weight of the side where the weight layer on the micro LED 201 is located may be increased, so that this side can be precisely inserted into the corresponding chip mounting cell 202 when the micro LED 201 is subjected to action of a centrifugal force.

Preferably, the micro LED 201 is provided with an alignment projection, and the alignment projection corresponds to the chip mounting cell 202 in terms of the shape and size. With the alignment projection, when the micro LED 201 is driven by the centrifugal force to allow other surfaces thereof to face towards the chip mounting cell 202, the micro LED 201 cannot be inserted in the chip mounting cell 202 because the other surface thereof are provided with no alignment projections, which can also ensure that the micro LED 201 is precisely inserted in the chip mounting cell 202.

As shown in FIG. 1, preferably, the solution drive assembly 3 includes a drive shaft 301, an impeller 302, and a drive motor 303. Specifically, the drive shaft 301 is disposed in the center of the solution container 1, the impeller 302 is fixedly disposed on the drive shaft 301, one end of the drive shaft 301 extends out of the solution container 1, and is connected to the drive motor 302; and the drive motor 303 drives the impeller 302 to rotate through the drive shaft 301, thereby providing a centrifugal force to the transfer solution 101 in the solution container 1.

The drive shaft 301 is a support shaft of the impeller 302 and is disposed in the solution container 1; the impeller 302 is disposed on the drive shaft 301; the drive shaft 301 rotates under control of the drive motor 303; the impeller 302 rotates to further drive the transfer solution 101 to rotate so that the transfer solution 101 generates a centrifugal force. The solution drive assembly 3 is composed of the drive shaft 301, the impeller 302, and the drive motor 303, the drive motor 303 drives the impeller 302 through the drive shaft 301, and thus the centrifugal force is provided by a simple structure to the transfer solution 101 in the solution container 1.

During implementing of the technical solutions of the disclosure, the display backplanes 2 are vertically arranged in the transfer solution 101, which is one of the key points. The plurality of chip mounting cells 202 on each of the display backplanes 2 are arranged in an array. When the display backplanes 2 are vertically arranged, the plurality of chip mounting cells 202, in each horizontal line, on the display backplanes 2 are parallel to the liquid level of the transfer solution 101. It is to be noted that, like the display backplanes 2, the solution container 1 is also in vertical arrangement.

In the above solution, the vertical arrangement means that the central axis is perpendicular to the ground. The solution container 1 is vertically arranged, the central axis of the solution container 1 is perpendicular to the ground, so that the liquid surface of the transfer solution 101 is flush with the ground. The display backplanes 2 are vertically arranged, the central axes of the display backplanes 2 are perpendicular to the ground, so that the plurality of chip mounting cells 202, in each horizontal line, on the display backplanes 2 are parallel to the liquid surface. Hence, according to the above technical solution, when the transfer solution 101 provides a centrifugal force to the micro LEDs 201 thereon, the centrifugal force directly pushes the micro LEDs 201 into the chip mounting cells 202 in a certain horizontal line, and thus the micro LEDs 201 are precisely transferred into the chip mounting cells 202 under action of the centrifugal force.

Figure 9:
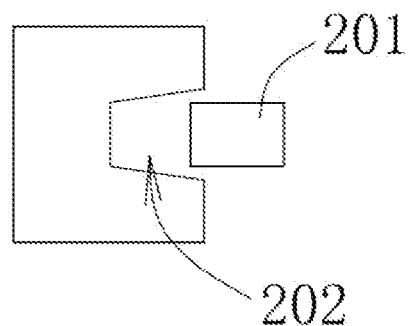
FIG. 9 is a schematic diagram of a chip mounting cell in a micro LED mass transfer apparatus according to the disclosure.

As shown in FIG. 9, preferably, the chip mounting cells 202 each are of a flared structure. The chip mounting cells 202 each are composed of a mounting cell bottom surface, a mounting cell opening and a mounting cell lateral surface; the area of the mounting cell bottom surface is smaller than that of the mounting cell opening, and the mounting cell lateral side gradually slopes from the mounting cell opening to the mounting cell bottom surface. The mounting cell bottom surface and the mounting cell lateral side form the chip mounting cell, and the mounting cell opening is formed at one side opposite to the mounting cell bottom surface. The chip mounting cells 202 each are of the flared structure, which facilitates entering of the micro LEDs 201 and can effectively improve the mass transfer efficiency.

Figure 2:
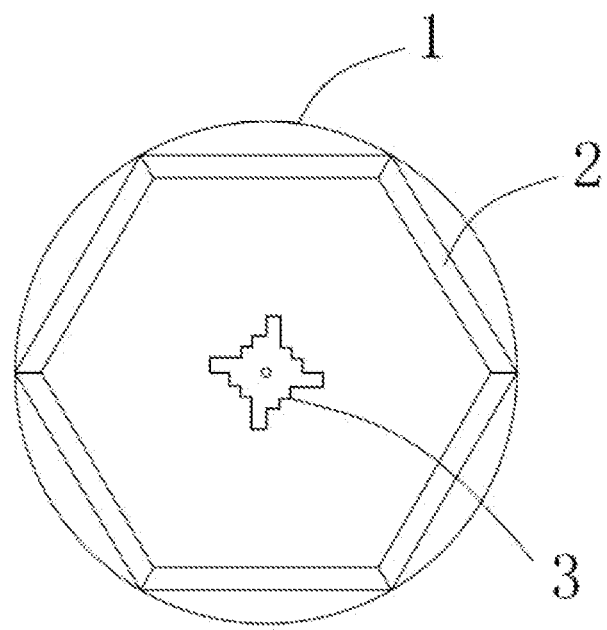
FIG. 2 is a top view of a solution container in a micro LED mass transfer apparatus according to the disclosure.
Figure 6:
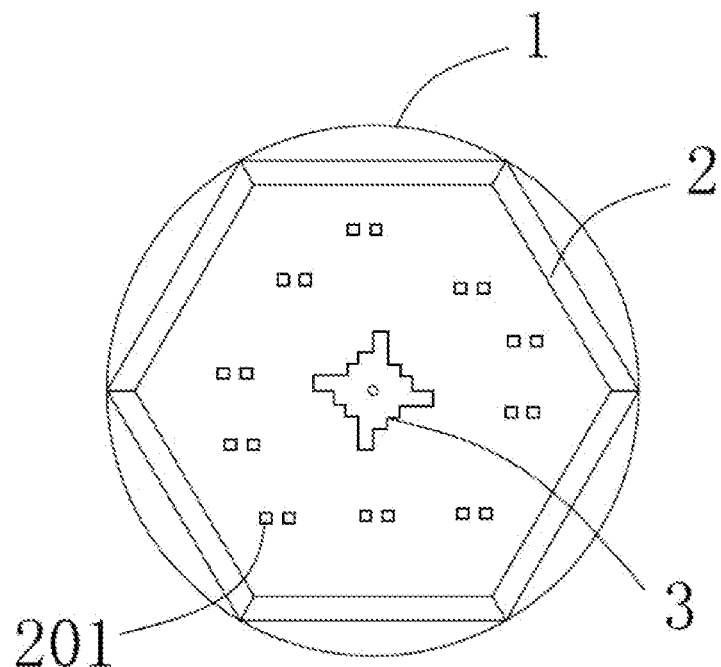
FIG. 6 is a top view of floating of micro LEDs in a micro LED mass transfer apparatus according to the disclosure.

As shown in FIG. 2 and FIG. 6, the solution container 1 is of a circular barrel structure. Since the solution container 1 is of the circular barrel structure, the mass transfer apparatus can accommodate more display backplanes 2, thereby facilitating further improvement of the mass transfer efficiency.

As shown in FIG. 2 and FIG. 6, when the solution container 1 is of the circular barrel structure, the solution container 1 may accommodate six backplanes 2 at the same time; when the solution container 1 is set as a square barrel structure, the solution container may accommodate only four display backplanes 2 at the same time. Above all, in the solution container 1 that is of the circular barrel structure, the micro LEDs 201 are distributed more uniform, and the centrifugal forces applied to the micro LEDs 201 at the moment of contact with the chip mounting cells 202 are more approximate, thereby facilitating improvement of the transfer efficiency, and avoiding the situation that some of the micro LEDs 201 violently impact the chip mounting cells 202 while other micro LEDs 201 are still stuck at the openings of the chip mounting cells 202.

To improve the mass transfer efficiency, generally, more micro LEDs 201 are placed in the transfer solution 101 than actually needed. For example, 120 micro LEDs 201 may be placed in the transfer solution 101 when 100 micro LEDs 201 are required to be transferred. Entering the chip mounting cells 202 under action of the centrifugal force is substantially a probability problem. Therefore, placing more micro LEDs 201 within a reasonable range can effectively improve the transfer efficiency. However, a certain number of micro LEDs 201 will remain in the transfer solution 101 after mass transfer is completed.

As shown in FIG. 1, preferably, a chip filter screen 102 is further disposed in the solution container 1, and is particularly disposed at the bottom of the solution container 1. It is to be particularly noted that the chip filter screen 102 is located above a joint of the solution pipeline 4. Only in this way can it prevent the micro LEDs 201 from entering the solution pipeline 4 by mistake during a process of lowering the liquid level.

The chip filter screen 102 may be configured for filtering the micro LEDs 201 to prevent the same entering the liquid level control pump 5 and may collect the remaining micro LEDs 201 to facilitate secondary utilization. The chip filter screen 102 is configured to collect the remaining micro LEDs 201, which can prevent the micro LEDs 201 entering a circulation of the transfer solution 101 on the one hand, and can collect the remaining micro LEDs 201 to facilitate the subsequent use on the other hand.

Preferably, the solution container 1 includes a container side wall and a container bottom. The container bottom is of a funnel structure, and the chip filter screen 102 is arranged in the container bottom.

Before replacing with another type of micro LEDs 201 for mass transfer as needed, the transfer solution 101 in the solution container 1 is required to be pumped out, and the remaining micro LEDs 201 are taken out and replaced with new micro LEDs 201. In a process that the liquid level of the transfer solution 101 gradually lowers, the micro LEDs 201 gradually fall along with the liquid level until touching the container bottom. Since the container bottom is set as the funnel structure, the micro LEDs 201 may, under action of dead gravity, further fall along the slope of the container bottom when touching the container bottom, so as to be gathered in the center of the container bottom. Hence, the container bottom is set as the funnel structure, which is conductive to increasing the collection efficiency of the remaining micro LEDs 201.

Preferably, the transfer solution 101 refers to a N-methylpyrrolidone solution or an acetone solution. With the N-methylpyrrolidone solution or the acetone solution as the transfer solution 101, the micro LEDs 201 can be conveniently directly transferred into the transfer solution 101 from the temporary substrate 8.

Figure 3:
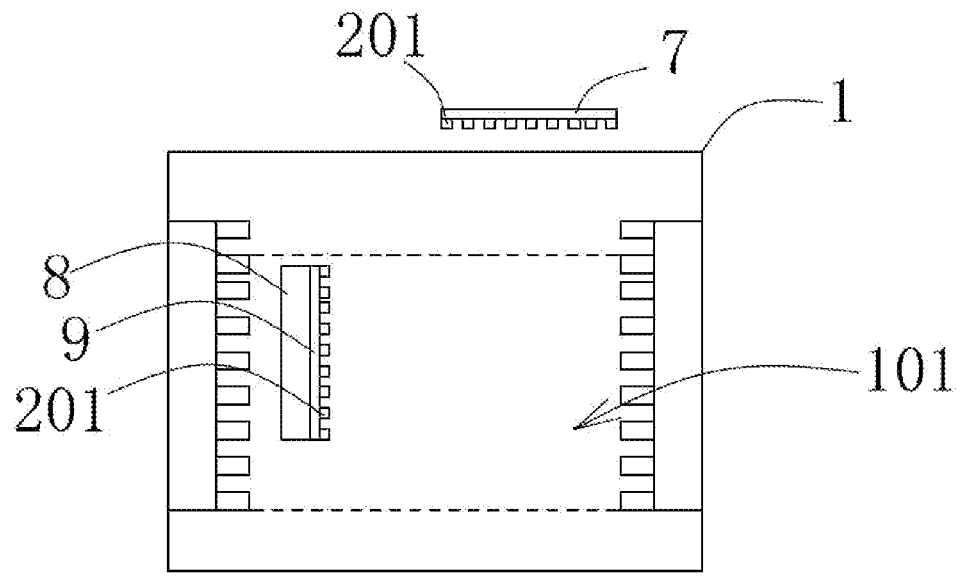
FIG. 3 is a schematic diagram of two placing modes of micro LEDs in a micro LED mass transfer apparatus according to the disclosure.

As shown in FIG. 3, in the technical solutions of the disclosure, at least two modes are provided for placing the to-be-transferred micro LEDs 201 in the transfer solution 101. One of the modes is that a growth substrate 7 is arranged above the solution container 1, the micro LEDs 201 on the growth substrate 7 are directly separated by means of laser lift-off, and the micro LEDs 201 separated from the growth substrate 7 fall into the transfer solution 101 under action of gravity. The other one is that the temporary substrate 8 is submerged into the transfer solution 101, a chip bonding layer 9 between the temporary substrate 8 and the micro LEDs 201 is dissolved through the transfer solution 101, so that the micro LEDs 201 directly fall into the transfer solution 101. The N-methylpyrrolidone solution or the acetone solution may serve as the transfer solution 101. The corresponding transfer solution 101 is selected according to chemical property of the chip bonding layer 9, so that the micro LEDs 201 can be placed in the second mode.

Preferably, besides the solution container 1, the display backplanes 2, the solution drive assembly 3, the solution pipeline 4, and the liquid level control pump 5, the micro LED mass transfer apparatus in the disclosure further includes a solution temporary-storage container 6 that is connected to the solution container 1 through the solution pipeline 4.

The solution temporary-storage container 6 is connected to the solution container 1 through the solution pipeline 4. The total amount of the transfer solution 101 in the solution temporary-storage container 6, the solution pipeline 4, and the solution container 1 is constant. Under action of the liquid level control pump 5, the transfer solution 101 is circulated among the solution temporary-storage container 6, the solution pipeline 4, and the solution container 1, so that a liquid level adjusting function can be implemented. Thus, since the solution temporary-storage container 6 is provided, with cooperation of the solution temporary-storage container 6, the liquid level control pump 5, and the solution pipeline 4, the liquid level of the transfer solution 101 is controlled.

Figure 10:
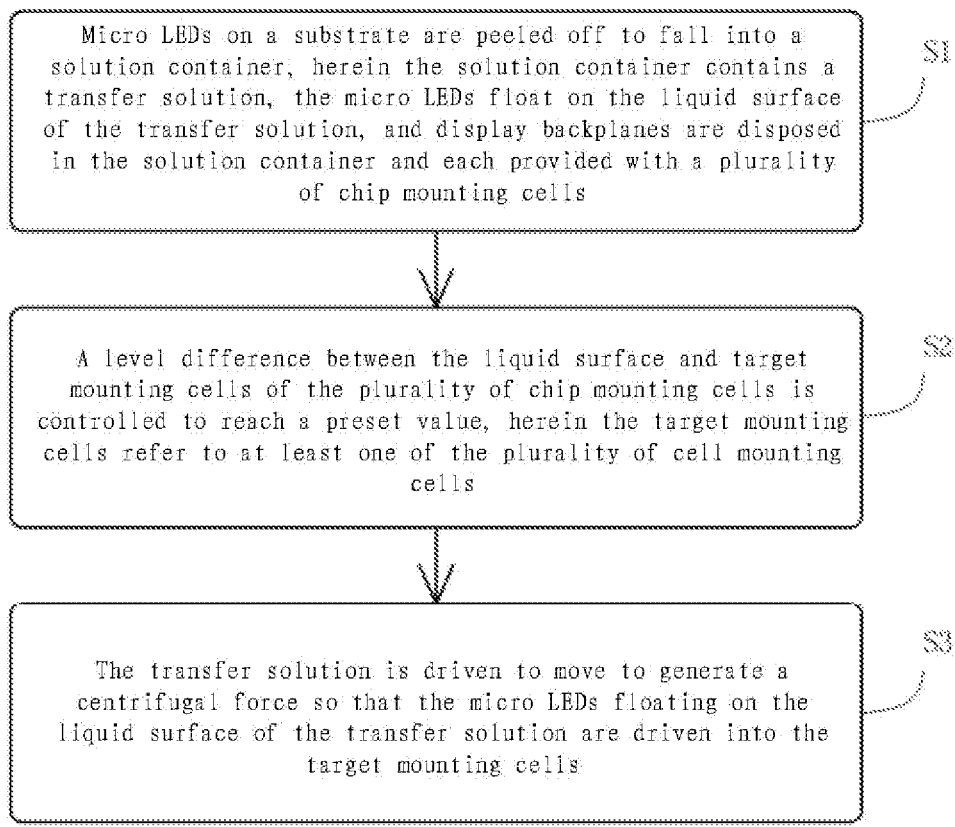
FIG. 10 is a flowchart of a micro LED mass transfer method according to the disclosure.

As shown in FIG. 10, correspondingly, the disclosure further provides a micro LED mass transfer method. The method based on the micro LED transfer apparatus includes the following steps.

At S1, micro LEDs on a substrate are peeled off to fall into a solution container, herein the solution container contains a transfer solution, the micro LEDs float on the liquid surface of the transfer solution, and display backplanes are disposed in the solution container and each provided with a plurality of chip mounting cells.

At S2, a level difference between the liquid surface and target mounting cells of the plurality of chip mounting cells is controlled to reach a preset value, herein the target mounting cells refer to at least one of the plurality of cell mounting cells.

At S3, the transfer solution is driven to move to generate a centrifugal force so that the micro LEDs floating on the liquid surface of the transfer solution are driven into the target mounting cells.

It is to be noted that during mass transfer, different micro LEDs are mounted in different chip mounting cells at different stages according to needs, and the target mounting cells refer to the chip mounting cells needed for mounting of the micro LEDs at a certain stage. In addition, the level difference between the liquid surface and the target mounting cells is controlled to reach a preset value, so that at least one of the chip mounting cells is exposed on the liquid surface.

Specifically, the substrate is a growth substrate or a temporary substrate.

When the substrate is the growth substrate, the process of peeling off the micro LEDs on the substrate into the solution container specifically includes: peeling off the micro LEDs on the growth substrate through laser, so the micro light-emitting diodes separated from the growth substrate fall in the transfer solution under action of gravity.

When the substrate is the temporary substrate, the process of peeling off the micro LEDs on the substrate into the solution container specifically includes: submerging the temporary substrate in the transfer solution, and dissolving a chip bonding layer between the temporary substrate and the micro LEDs through the transfer solution so that the micro LEDs are separated from the temporary substrate to directly fall into the transfer solution.

Preferably, the micro LEDs include at least two types of micro LEDs. The method specifically includes the following steps.

One type of micro LEDs are peeled off to fall into the solution container.

A level difference between the liquid surface and the target mounting cells of the micro LEDs is controlled to reach a preset value.

The transfer solution is driven to move to generate a centrifugal force so that the micro LEDs floating on the liquid surface of the transfer solution are driven into the corresponding target mounting cells.

The level difference between the liquid surface and the other target mounting cells for mounting of the micro LEDs is controlled again to reach the preset value, and the transfer solution is further driven to move to generate a centrifugal force, so that the type of micro LEDs are driven to fall into the other target mounting cells until transfer of the type of micro LEDs required to be mounted in the target mounting cells is completed.

The type of micro LEDs are replaced with another type of micro LEDs which are peeled off to fall into the solution container.

A level difference between the liquid surface and the target mounting cells of the micro LEDs is controlled to reach a preset value.

The transfer solution is driven to move to generate a centrifugal force so that the micro LEDs floating on the liquid surface of the transfer solution are driven into the corresponding target mounting cells.

The level difference between the liquid surface and the other target mounting cells for mounting of the micro LEDs is controlled again to reach the preset value, and the transfer solution is further driven to move to generate a centrifugal force, so that another type of the micro LEDs are driven to fall into the other target mounting cells until transfer of another type of micro LEDs required to be mounted in the target mounting cells is completed.

More preferably, before replacing with another type of micro LEDs, the following step is included.

All previous type of micro LEDs are taken out.

To improve the mass transfer efficiency, generally, more micro LEDs 201 are placed in the transfer solution 101 than actually needed. For example, 120 red micro LEDs 201 may be placed in the transfer solution 101 when 100 red micro LEDs 201 are required to be transferred. Entering the chip mounting cells under action of the centrifugal force is substantially a probability problem. Therefore, placing more red micro LEDs within a reasonable range can effectively improve the transfer efficiency. However, a certain number of red micro LEDs will remain in the transfer solution after mass transfer is completed. Thus, before replacing with another type of micro LEDs, the previous type of micro LEDs are taken out, the remaining red micro LEDs are collected, the green micro LEDs or blue micro LEDs are placed again, thereby preventing position errors of the micro LEDs, and facilitating that various types of the micro LEDs are precisely mounted at specific positions of the micro LEDs.

The micro LED mass transfer method will be described in detail below with reference to the drawings.

Figure 8:
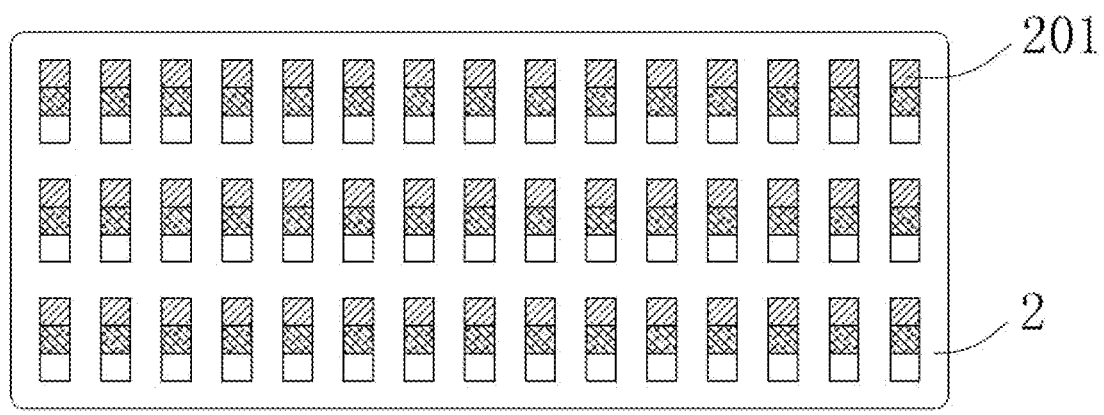
FIG. 8 is a schematic diagram of a display backplane after transfer is completed in a micro LED mass transfer apparatus according to the disclosure.

As shown in FIG. 1 and FIG. 8, each display backplane 2 is provided with a plurality of chip mounting cells 202, and micro LEDs 201 are mounted in the chip mounting cells 202. Generally, the plurality of micro LEDs 201 form an LED array, that is, the micro LEDs 201 are neatly arranged in a horizontal line as a whole. Red, green and blue are three-primary colors. The micro LEDs include at least two types of micro LEDs. In a specific implementation of the disclosure, in order to implement a full-color display function, the display backplane 2 is required to be provided with red micro LEDs, green micro LEDs, and blue micro LEDs. The red micro LEDs, the green micro LEDs, and the blue micro LEDs are required to be arranged neatly. Specifically, taking FIG. 8 as an example, the red micro LEDs, the green micro LEDs, and the blue micro LEDs are required to be arranged neatly. That is, in FIG. 9, all the micro LEDs 201 in the first line are blue micro LEDs, all the micro LEDs 201 in the second line are green micro LEDs, and all the micro LEDs 201 in the third line are red micro LEDs. In addition, it is to be noted that, generally, the red micro LEDs, the green micro LEDs, and the blue micro LEDs are respectively arranged in line and arranged at regular intervals on one display backplane 2. As shown in FIG. 8, nine lines of micro LEDs are provided, the first, fourth and seventh lines have the same type, the second, fifth, and eighth lines have the same type, and the third, sixth, and ninth lines have the same type. With the special structural configuration of the disclosure, mass transfer of the micro LEDs 201 is achieved with high efficiency and low cost.

Figure 4:
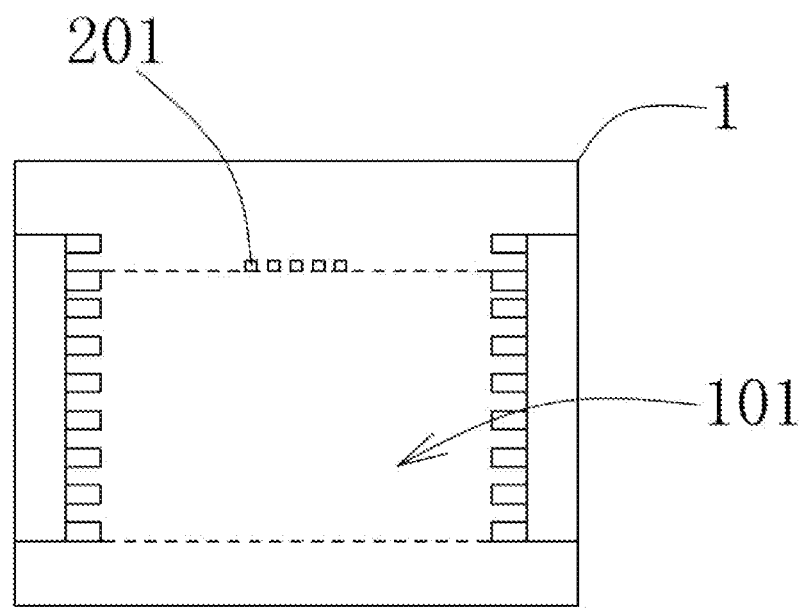
FIG. 4 is a first schematic diagram of floating of micro LEDs in a micro LED mass transfer apparatus according to the disclosure.

As shown in FIG. 4, the transfer solution 101 is put in the solution container 1, the display backplanes 2 are vertically arranged in the transfer solution 101, the micro LEDs 201 in single color are placed in the solution, and the micro LEDs 201 to be transferred are allow to float on the liquid surface of the transfer solution 101. Specifically, at least two modes are provided for placing the to-be-transferred micro LEDs 201 into the transfer solution 101, which have been described in detail above, and will not be elaborated here. It is to be noted that the number of the micro LEDs 201 placed should be greater than the number actually needed, thereby ensuring that mass transfer can be completed successfully and improving the transfer efficiency. In the embodiment, the red micro LEDs are taken as an example for description, that is, the single-color micro LEDs are the red micro LEDs.

The transfer of the red micro LEDs is completed first, followed by completing of the transfer of the green micro LEDs and the blue micro LEDs.

As shown in FIG. 4, after the micro LEDs 201 are placed, the liquid level control pump 5 is started, to pump the transfer solution 101 out or into the solution container 1 through the solution pipeline 4, to control the liquid level of the transfer solution 101 in the solution container 1, so that the chip mounting cells 202 are exposed on the liquid surface.

As shown in FIG. 1 and FIG. 6, the solution drive assembly 3 is started, the drive motor 303 drives the impeller 302 that is arranged by taking the drive shaft 301 as a center shaft, the transfer solution 101 is driven by the impeller 302 to rotate to generate a centrifugal force, the micro LEDs 201 in the transfer solution 101 are allow to enter a row of chip mounting cells 202, flush with the liquid surface, on the corresponding display backplane 2, under action of the centrifugal force and a buoyancy. After a certain period of time, transfer of the micro LEDs in the row of chip mounting cells is completed. Here, the micro LEDs 201 are all mounted in the row of chip mounting cells 202, the drive motor 303 can be turned off, waiting for the transfer solution 101 to return to be standing.

Figure 5:
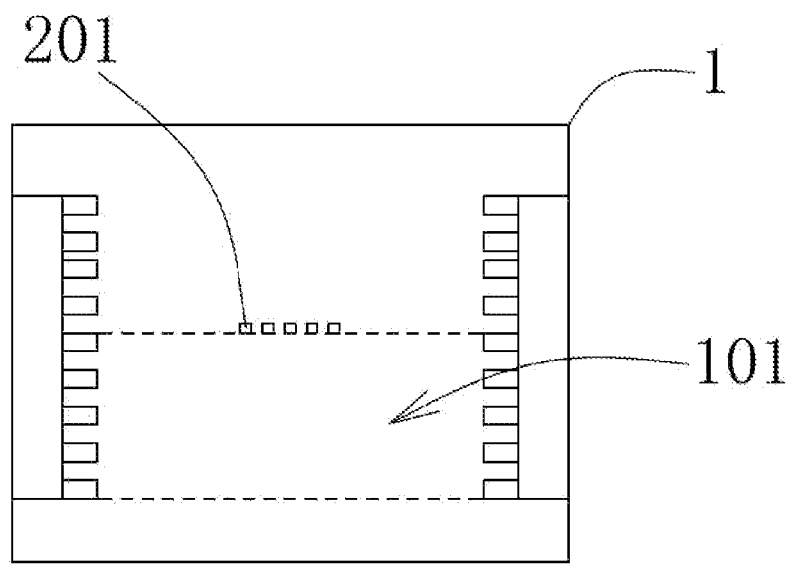
FIG. 5 is a second schematic diagram of floating of micro LEDs in a micro LED mass transfer apparatus according to the disclosure.

As shown in FIG. 5, after transfer of the micro LEDs in the row of chip mounting cells 202 is completed, the liquid level control pump 5 is started again to control the liquid surface of the transfer solution 101 to rise or fall, so that the micro LEDs 201 to be transferred are flush with another row of chip mounting cells 202 on the corresponding display backplane 2. Comparing FIG. 4 and FIG. 5, the transfer solution 101 in FIG. 4 has high liquid level, while the transfer solution 101 in FIG. 5 has low liquid level, thus, the liquid level is controlled to fall in the embodiment. During implementation, the liquid level can also be controlled to rise.

The solution drive assembly 3 is started again to provide a centrifugal force to the micro LEDs 201, the micro LEDs 201 are allowed to enter a second row of chip mounting cells 202 to be flush with the same. The drive motor 303 is then turned off, waiting for the transfer solution 101 to return to be standing.

Figure 7:
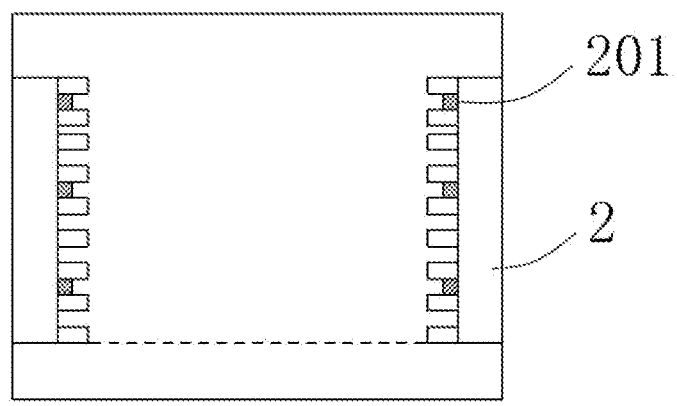
FIG. 7 is a schematic diagram of completing transfer of one type of micro LEDs in a micro LED mass transfer apparatus according to the disclosure.

The previous step is repeated until all the red micro LEDs are mounted in the chip mounting cells 202, required for mounting of the red micro LEDs, on the display backplanes 2, and thus transfer of the red micro LEDs may be completed. As shown in FIG. 7, it can be seen that after the previous steps are performed, all the red micro LEDs are mounted in the specific chip mounting cells 202 on the display backplanes 2.

After the remaining red micro LEDs in the transfer solution 101 are taken out, the green micro LEDs or blue micro LEDs are placed, and operations are repeated according to the previous steps, so that mass transfer of all micro LEDs may be completed.

After transfer is completed, the display backplanes 2 are taken out, and moistures on the display backplanes 2 are removed by a dehumidifying operation. In order to prevent the display apparatus from being affected by liquid corrosion during use, drying or airing is required, heating for drying can be performed along with heat binding, so that processing time is shortened, and production efficiency is improved.

To sum up, the disclosure provides a micro LED mass transfer apparatus and a micro LED mass transfer method. The micro LED mass transfer apparatus specifically includes a solution container 1, one or a plurality of display backplanes 2, a solution drive assembly 3, a solution pipeline 4, and a liquid level control assembly 5. The solution container 1 contains a transfer solution 101, and micro LEDs 201 to be transferred float on the liquid surface of the transfer solution 101. The display backplanes 2 are submerged in the transfer solution 101 and each provided with a plurality of chip mounting cells 202. The solution drive assembly 3 is disposed in the solution container 1 and configured to provide a centrifugal force to the transfer solution 101. The solution pipeline 4 is connected to the solution container 1. The liquid level control assembly 5 is disposed on the solution pipeline 4, and configured to control a liquid level of the transfer solution 101 in the solution container 1. Compared with the related art, the technical solutions have the beneficial effect that the display backplanes 2, the micro LEDs 201, and the like are placed in the transfer solution 101 in the solution container 1, the liquid level control pump 5 and the solution pipeline 4 control the liquid level of the transfer solution 101, the solution drive assembly 3 provides a centrifugal force to the transfer solution 101, the micro LEDs 201 are precisely transferred into the corresponding chip mounting cells 202 through the centrifugal force, and thus mass transfer is achieved by means of the simple devices, with the advantages such as low cost and high efficiency.

It is to be understood that applications of the disclosure are not limited to the examples described above, those of ordinary skill may make modifications or variations according to the foregoing description, and all these modifications and variations shall fall into the scope of protection of the disclosure.

What claimed is:

1. A micro light-emitting diode mass transfer apparatus, comprising:

a solution container, wherein the solution container contains a transfer solution, and micro light-emitting diodes to be transferred float on the liquid surface of the transfer solution;

one or a plurality of display backplanes submerged in the transfer solution, wherein the one display backplane or each of the plurality of display backplane is provided with a plurality of chip mounting cells, mounting cell opening directions of the plurality of chip mounting cells face toward the micro light-emitting diodes, and at least one of the plurality of chip mounting cells is exposed on the liquid surface;

a solution drive assembly, wherein the solution drive assembly is disposed in the solution container and configured to provide a centrifugal force to the transfer solution so that the micro light-emitting diodes are driven to move into the at least one chip mounting cell exposed on the liquid surface under action of the centrifugal force and a buoyancy provided by the transfer solution; and a liquid level control assembly, wherein the liquid level control assembly is connected to the solution container and configured to control a liquid level of the transfer solution in the solution container so as to expose at least one more chip mounting cell or submerge a part of the chip mounting cells exposed before, wherein the solution drive assembly comprises a drive shaft, an impeller and a drive motor; and the drive shaft is disposed in the center of the solution container, the impeller is fixedly disposed on the drive shaft, one end of the drive shaft extending out of the solution container is connected to the drive motor; and the drive motor drives the impeller to rotate through the drive shaft, thereby providing the centrifugal force to the transfer solution in the solution container.

2. The micro light-emitting diode mass transfer apparatus according to claim 1, wherein each of the chip mounting cells is of a flared structure.

3. The micro light-emitting diode mass transfer apparatus according to claim 1, wherein each chip mounting cell is composed of a mounting cell bottom surface, a mounting cell opening and a mounting cell lateral side; the area of the mounting cell bottom surface is smaller than that of the mounting cell opening, and the mounting cell lateral side gradually slopes from the mounting cell opening to the mounting cell bottom surface.

4. The micro light-emitting diode mass transfer apparatus according to claim 1, wherein the transfer solution refers to a N-methylpyrrolidone solution or an acetone solution.

5. The micro light-emitting diode mass transfer apparatus according to claim 1, further comprising a solution temporary-storage container, wherein the solution temporary-storage container is connected to the solution container.

6. A micro light-emitting diode mass transfer method, comprises:

poeling off micro light-emitting diodes on a substrate into the solution container, wherein the solution container contains the transfer solution, the micro light-emitting diodes float on the liquid surface of the transfer solution, and one or a plurality of display backplanes is disposed in the solution container and the one display backplane or each of the plurality of display backplanes is provided with a plurality of chip mounting cells;

controlling a level difference between the liquid surface and one or more target mounting cells of the plurality of chip mounting cells to reach a preset value; and driving the transfer solution to move to generate a centrifugal force so that one or more of the micro light-emitting diodes floating on the liquid surface of the transfer solution are driven into the one or more target mounting cells.

7. The micro light-emitting diode mass transfer method according to claim 6, wherein the substrate is a growth substrate, and peeling off the micro light-emitting diodes on the substrate into the solution container comprises:

peeling off the micro light-emitting diodes on the growth substrate through laser, so that the micro light-emitting diodes separated from the growth substrate fall into the transfer solution under action of gravity.

8. The micro light-emitting diode mass transfer method according to claim 6, wherein the substrate is a temporary substrate, and peeling off the micro light-emitting diodes on the substrate into the solution container comprises:

submerging the temporary substrate in the transfer solution, and dissolving a chip bonding layer between the temporary substrate and the micro light-emitting diodes through the transfer solution so that the micro light-emitting diodes are separated from the temporary substrate to directly fall into the transfer solution.

9. The micro light-emitting diode mass transfer method according to claim 6, wherein the micro light-emitting diodes at least comprise: red micro light-emitting diodes, green micro light-emitting diodes, and blue micro light-emitting diodes.

\* \* \* \* \*